(12) United States Patent
Tuncer

(10) Patent No.: US 12,266,595 B2
(45) Date of Patent: Apr. 1, 2025

(54) SEMICONDUCTOR DEVICE PACKAGE WITH ISOLATED SEMICONDUCTOR DIE AND ELECTRIC FIELD CURTAILMENT

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/295,793

(22) Filed: Apr. 4, 2023

(65) Prior Publication Data

US 2023/0245957 A1    Aug. 3, 2023

Related U.S. Application Data

(63) Continuation of application No. 17/538,841, filed on Nov. 30, 2021, now Pat. No. 11,621,215.

(51) Int. Cl.
  *G01R 15/20* (2006.01)
  *G01R 19/00* (2006.01)
  (Continued)

(52) U.S. Cl.
  CPC ...... *H01L 23/49541* (2013.01); *G01R 15/202* (2013.01); *G01R 19/0092* (2013.01);
  (Continued)

(58) Field of Classification Search
  CPC ........... H01L 23/49541; H01L 23/3107; H01L 23/4951; H01L 23/49513; H01L 24/48; G01R 15/202; G01R 19/0092
  See application file for complete search history.

(56) References Cited

U.S. PATENT DOCUMENTS 6,137,165 A    10/2000 Thierry
7,109,587 B1 *  9/2006 Li ........................... H01L 24/83
                                                                257/782
(Continued)

OTHER PUBLICATIONS

Texas Instruments Incorporated, "TMCS1107 3% Basic Isolation Hall-Effect Current Sensor", Datasheet, Jan. 2021-revised Jul. 2021, retrieved from the uniform resource locator (url): https://www.ti.com/lit/gpn/tmcs1107 on Nov. 30, 2021.

*Primary Examiner* — Dominic E Hawkins
(74) *Attorney, Agent, or Firm* — Dawn Jos; Frank D. Cimino

(57) ABSTRACT

In a described example, an apparatus includes: a lead frame having a first portion and having a second portion electrically isolated from the first portion, the first portion having a side surface normal to a planar opposite surface, and having a recessed edge that is notched or chamfered and extending between the side surface and a planar device side surface; a spacer dielectric mounted to the planar device side surface and partially covered by the first portion, and extending beyond the first portion; a semiconductor die mounted to the spacer dielectric, the semiconductor die partially covered by the spacer dielectric and extending beyond the spacer dielectric; the second portion of the lead frame comprising leads coupled to the semiconductor die by electrical connections; and mold compound covering the semiconductor die, the electrical connections, the spacer dielectric, and partially covering the first portion and the second portion.

15 Claims, 11 Drawing Sheets

(51) Int. Cl.
*H01L 21/48* (2006.01)
*H01L 21/56* (2006.01)
*H01L 23/00* (2006.01)
*H01L 23/31* (2006.01)
*H01L 23/495* (2006.01)
*H10N 52/00* (2023.01)

(52) U.S. Cl.
CPC .......... *H01L 21/4803* (2013.01); *H01L 21/56* (2013.01); *H01L 23/3107* (2013.01); *H01L 24/05* (2013.01); *H01L 24/85* (2013.01); *H10N 52/101* (2023.02); *H01L 24/48* (2013.01); *H01L 2224/04042* (2013.01); *H01L 2224/48175* (2013.01)

(56) References Cited

U.S. PATENT DOCUMENTS

| | | | |
|---|---|---|---|
| 7,633,140 B2 * | 12/2009 | Luo | H01L 24/37 257/787 |
| 11,021,786 B2 * | 6/2021 | Nguyen | H01L 24/13 |
| 11,515,238 B2 * | 11/2022 | Ge | H01L 23/49562 |
| 11,614,482 B1 * | 3/2023 | Tuncer | G01R 31/2896 324/762.02 |
| 2007/0187805 A1 | 8/2007 | Lee et al. | |
| 2014/0027891 A1 * | 1/2014 | Kimura | H01L 24/83 438/122 |
| 2018/0306842 A1 * | 10/2018 | Fukunaka | H01L 24/85 |
| 2019/0088576 A1 * | 3/2019 | Higgins, III | H01L 23/645 |
| 2020/0294896 A1 | 9/2020 | Navaretnasinggam et al. | |
| 2022/0084977 A1 * | 3/2022 | Fay | H01L 24/48 |

* cited by examiner

SEMICONDUCTOR DEVICE PACKAGE WITH ISOLATED SEMICONDUCTOR DIE AND ELECTRIC FIELD CURTAILMENT

This application is a continuation to patent application Ser. No. 17/538,841, filed Nov. 30, 2021, the contents of which are herein incorporated by reference in its entirety.

TECHNICAL FIELD

This relates generally to packaging semiconductor devices, and more particularly to semiconductor device packages with integrated isolation between a semiconductor die and a high voltage input.

BACKGROUND

For integrated semiconductor devices with internal isolation in a device package, semiconductor dies are separated from high voltage signals by an isolation barrier. For example, a semiconductor die with an integral Hall element configured as a current sensor can be mounted to a package substrate, such as a lead frame, by dielectric materials. A high voltage input signal, having a maximum voltage of hundreds of volts, a kilovolt or several kilovolts, can be coupled to the lead frame. A Hall current sensor within the semiconductor die will output a signal that varies in response to a magnetic field caused by the current flowing in portions of the lead frame, while the semiconductor die remains electrically isolated from the high voltage. The package substrate can include additional leads that are also isolated from the high voltage. The additional leads can be coupled to the semiconductor die to provide power, control, and output signals for the semiconductor die. Other types of semiconductor devices needing electrical isolation can be mounted in a semiconductor device package. For example, a pair of semiconductor dies may form a transformer of inductors having coils spaced by an isolation dielectric layer, this arrangement enables the transmission of power across isolated components without direct connection.

The high voltage input to the semiconductor device package can create a high electric field. Dielectric materials such as die attach and mold compound can fail in the high electric field, causing defects, arcing, and shorts. To provide a robust semiconductor device package with the capability of being coupled to a high voltage in the kilovolts range, the semiconductor device package needs to be designed to be compatible with high voltages at the inputs and to be able to sustain the resulting electric fields without damage to the semiconductor device package or to the semiconductor die.

SUMMARY

In a described example, an apparatus includes. a package substrate including a first portion and a second portion spaced from and electrically isolated from the first portion, the package substrate being a conductive lead frame, the first portion having a planar device side surface and a planar opposite surface, and having a side surface normal to the planar opposite surface extending towards the device side surface, and having a recessed edge that is notched or chamfered and extending between the side surface and the planar device side surface, the recessed edge extending from the side surface inwards with respect to the first portion. A spacer dielectric having a first surface and a second surface opposite the first surface is mounted to the planar device side surface of the first portion of the package substrate, the spacer dielectric is partially covered by the first portion, and extending beyond the first portion.

A semiconductor die is mounted to the second surface of the spacer dielectric, the semiconductor die is partially covered by the spacer dielectric and has bond pads formed on a surface of the semiconductor die that extends beyond an edge of the spacer dielectric. The second portion of the lead frame includes leads coupled to the bond pads of the semiconductor die by electrical connections; and mold compound covers the semiconductor die, the electrical connections, the spacer dielectric, portions of the first portion of the lead frame and portions of the second portion of the lead frame. The semiconductor die is electrically isolated from the first portion of the lead frame. In an additional arrangement, the semiconductor die has notched edges. In example arrangements, the semiconductor die is a current sensor, and includes a Hall element for sensing current flowing in the first portion of the lead frame.

DETAILED DESCRIPTION

Figure 1:
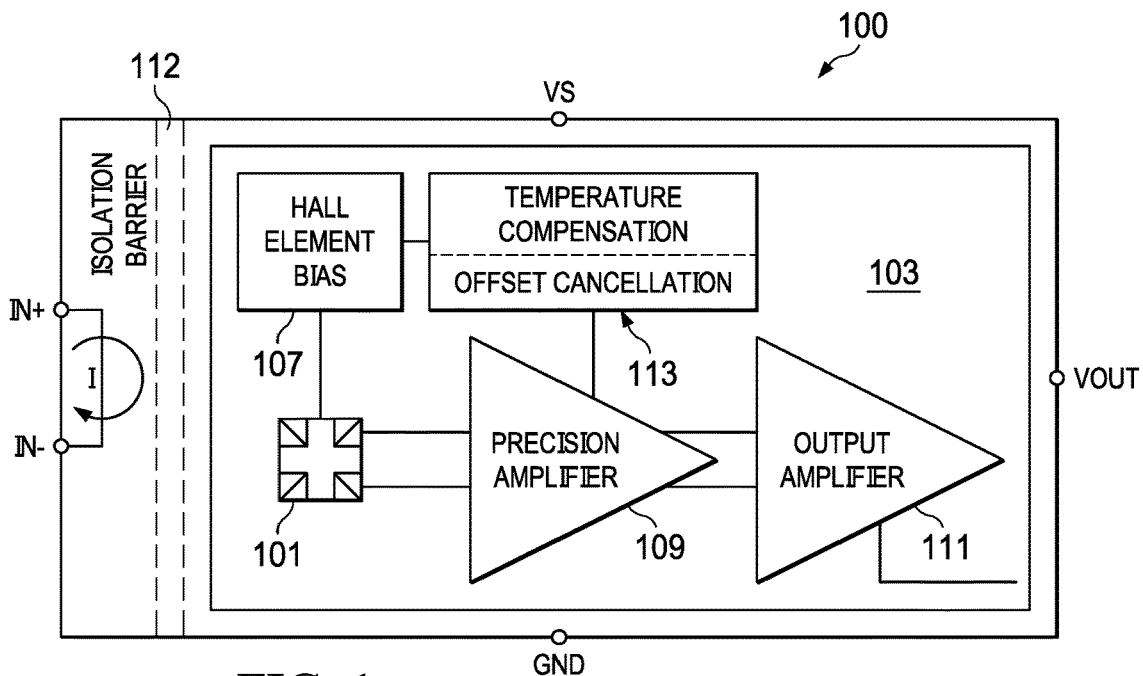
FIG. 1 illustrates in a circuit block diagram a Hall current sensing device with isolation.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. Semiconductor dies for power applications useful in the arrangements include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package. In example arrangements, a semiconductor die includes a Hall element configured as a current sensor.

The term "semiconductor device package" is used herein. A semiconductor device package has at least one semiconductor die electronically coupled to terminals and has a package body that protects and covers the semiconductor die. In some arrangements, multiple semiconductor dies can be packaged together in a semiconductor device package. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing the package substrate and a backside surface facing away from the package substrate. The semiconductor device package can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the semiconductor device package.

The term "package substrate" is used herein. A package substrate is a substrate arranged to receive a semiconductor die and to support the semiconductor die in a completed semiconductor device package. Package substrates include conductive lead frames, which can be formed from copper, aluminum, stainless steel and alloys such as Alloy 42 and other alloys. The lead frames can include a die pad for mounting the semiconductor die, and conductive leads arranged spaced from the die pad for electrical connections coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound. The completed devices can then be removed one from another by cutting through the mold compound and the package substrate between the mounted semiconductor dies. In an example arrangement, a package substrate is a conductive lead frame with two portions, the two portions are isolated from one another, each portion includes conductive leads.

The lead frames can include plated, stamped and partially etched lead frames. In a partially etched lead frame, two levels of metal can be formed form a sheet of material by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant 4 (FR4).

Leaded packages can be used with the arrangements where the leads extend away from the package body and are shaped to form a portion for soldering to a board. A dual in line package, or "DIP", can be used with the arrangements. A thin DIP package arranged with leads for surface mounting can be referred to as a small outline integrated circuit or "SOIC" package. SOIC packages of various types can be used with the arrangements, including narrow body, wide body, and double wide or wider body SOIC packages. Single sided packages such as leaded center bond packages can be used. No lead packages, where the package terminals are coextensive with the molded package body, can be used with the arrangements, including quad flat no lead (QFN) and small outline no lead (SON) packages.

The term "spacer dielectric" is used herein. A spacer dielectric is in insulating layer that provides electrical isolation between devices mounted to it. Spacer dielectrics for use in the arrangements include printed circuit board materials, such as flame retardant 4 (FR4), glass reinforced epoxy or fiber substrates, bismaleimide triazine resin (BT) resin substrates, ceramics, other epoxies, resins, tapes and films. The spacer dielectric can be a laminate of layered dielectric materials.

The term "chamfered" is used herein to describe a surface. A chamfered surface is a surface that extends from an edge of an object at a slope or an angle. In an arrangement, a portion of a package substrate has a chamfered surface.

In the arrangements, a package substrate has a first portion spaced from and electrically isolated from a second portion. The package substrate may be a conductive lead frame. The first portion of the conductive lead frame includes a first lead (or first group of leads) to be coupled to a first node and a second lead (or second group of leads) to be coupled to a second node. A high voltage of several hundred volts, a kilovolt or even several kilovolts can be coupled to the first lead, and current flows through the first portion of the lead frame and through a current sense portion of the lead frame arranged to carry a current between the first lead or first leads and the second lead or second leads. A spacer dielectric is mounted to a planar device side surface of the first portion of the lead frame, the first portion has a planar opposite surface opposite the planar device side surface. A semiconductor die that includes a current sensor is mounted to the spacer dielectric so that the semiconductor die is electrically isolated from the first portion of the lead frame. The semiconductor die is arranged to lie within a magnetic field corresponding to a current flowing in the current sense portion of the first portion of the lead frame. In an example the semiconductor die includes a Hall element configured as a current sensor. Electrical connections are made between bond pads on the semiconductor die and a third lead in the second portion of the lead frame. A mold compound covers at least part of the first portion and part of the second portion of the lead frame, and covers the spacer dielectric, the semiconductor die; portions of the first lead, the second lead and the third lead are exposed from the mold compound to form package terminals.

In the arrangements, structures are formed to curtail the concentration in electric fields that are present when a high voltage is coupled to the first portion of the lead frame, for example a high voltage greater than several hundred volts such as 1 kV or several kilovolts may be coupled to the first lead. In one arrangement, the first portion of the lead frame has a recessed edge that is chamfered where the first portion of the lead frame surface is mounted to a surface of the spacer dielectric. In another arrangement, the surface of the lead frame has a recessed edge that is notched where the first portion meets the surface of the spacer dielectric. In additional arrangements, the semiconductor die also has a recessed edge that is notched at the surface that is mounted to the spacer dielectric. In additional arrangements, these structures are combined and provided in a semiconductor device package. The concentration of the electric field at the junctions between the first portion of the lead frame, the spacer dielectric, the mold compound, and the semiconductor die is reduced when the structures are used, improving performance and preventing damage to the packaged semiconductor device due to dielectric breakdowns caused by concentrations in the electric field. The arrangements can be adopted using existing materials and processes, without substantial added costs and without the need for additional materials, and are thus cost effective and easily implemented.

FIG. 1 is a circuit block diagram for a semiconductor device package 100 that is one example application for an arrangement. The example semiconductor device package 100 is a Hall current sensor. Other circuits, for example for devices that employ transformers, can be used with the arrangements. In addition to current sensing for high voltage signals, additional applications for isolation in a semiconductor device package include power transmission across voltage regimes at separate ground potentials and communications, for example in isolated signaling between transceiver devices operating at different voltage potentials. Power supply circuitry including alternating current (AC) isolation, DC-DC converters, and load protection circuitry can be used with the arrangements.

In FIG. 1, an input IN+ can be coupled to a first node and can receive a signal carrying current labeled I, for example the node at IN+ may be coupled to a high voltage signal or voltage supply, and an output IN− can be coupled to a second node, output IN− outputs the current I. A semiconductor die 103 within semiconductor device package 100 includes a Hall element 101. Circuitry needed to control and monitor the Hall element 101 are provided in semiconductor die 103 including a Hall Element Bias circuit 107, a Temperature Compensation and Offset Cancellation circuit 113, a Precision Amplifier 109, and an Output Amplifier 111.

In operation, the output amplifier 111 drives an output VOUT that corresponds to the magnitude of the current I or which changes with variations in the current I. In operation, a magnetic field that occurs due to the current I is sensed by the Hall element 101 within semiconductor die 103, and a voltage VOUT corresponding to the magnitude of the magnetic field is output by semiconductor die 103. In a system, a calibration scheme can be used to determine the value of the current I from the voltage that appears at the output VOUT. An isolation barrier 112 is shown, the isolation barrier is formed by use of a package substrate with isolated portions to mount the semiconductor die 103 within the magnetic field due to current I, but keeping the semiconductor die electrically isolated from the input IN+ and the output IN− where the current I is supplied.

Figure 2C:
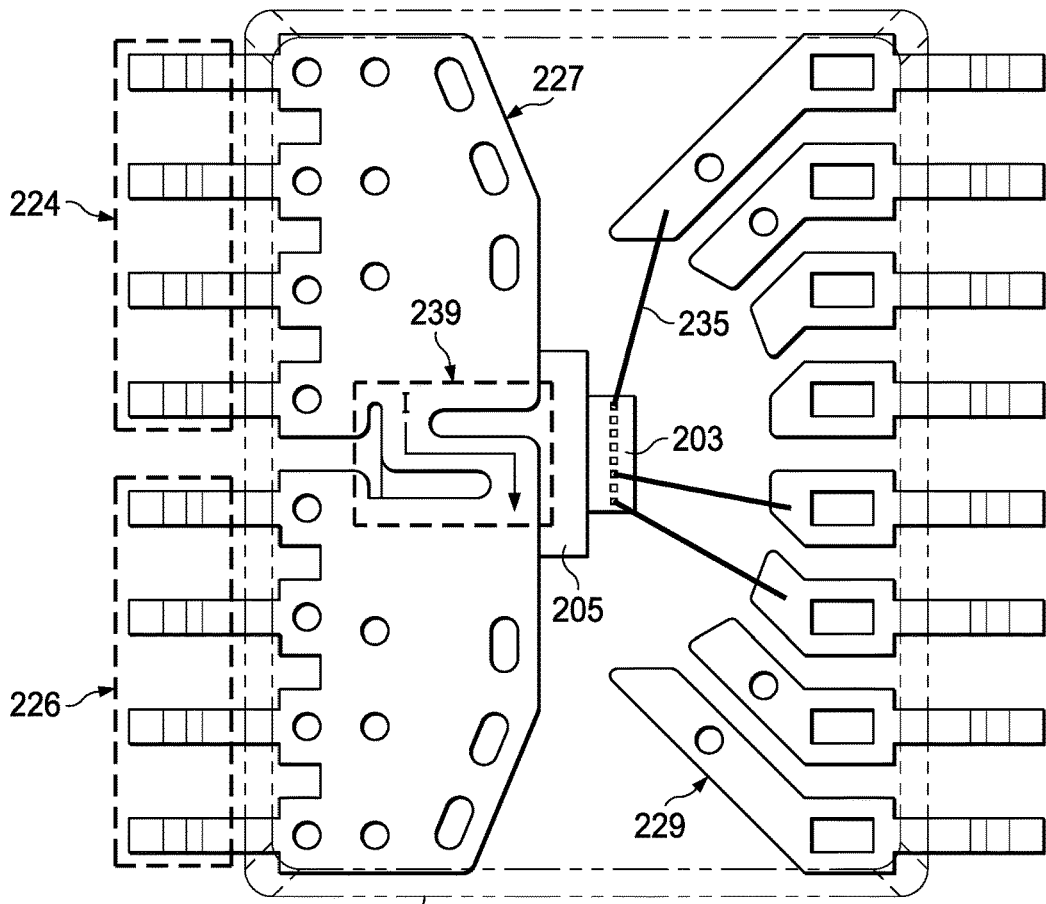
FIGS. 2A-2C illustrate, in a projection view, a partial projection view, and a plan view, a semiconductor device package for a Hall current sensor.
Figure 2A:
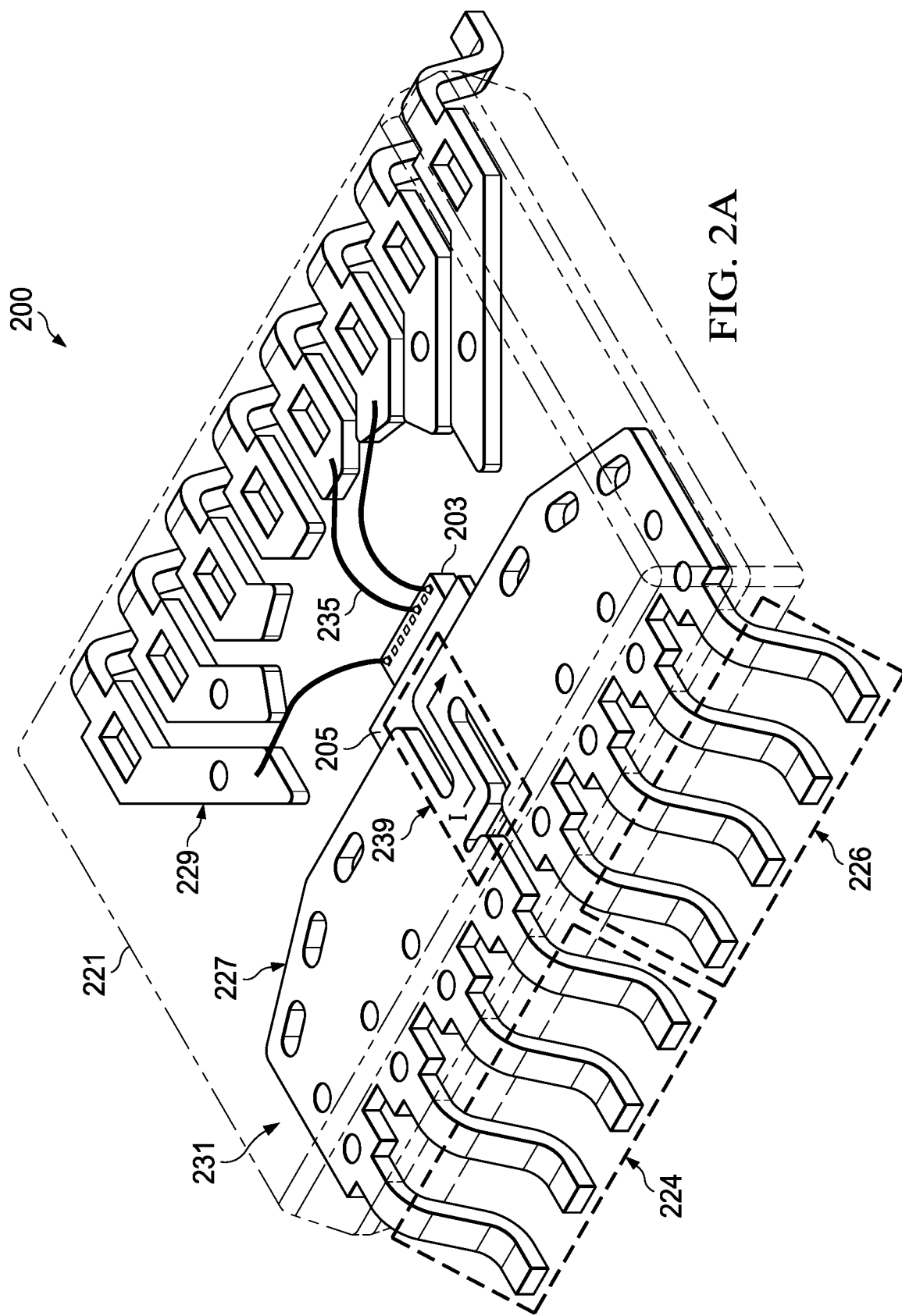

FIG. 2A illustrates, in a projection view, a semiconductor device package 200 for use with an arrangement. A package substrate 231, here a conductive lead frame, is shown with a first portion 227 having several leads, and a second portion 229 having several leads, the first portion 227 and second portion 229 are spaced apart and electrically isolated from one another. A semiconductor die 203, which can include a Hall element and which is similar to semiconductor die 103 in FIG. 1, is mounted to a spacer dielectric 205, and the spacer dielectric 205 is mounted to the first portion 227 of the package substrate 231. In this manner, the semiconductor die 203 is near, but not electrically coupled to, the first portion 227 of the package substrate 231. The second portion 229 of the package substrate 231 is electrically connected to the semiconductor die 203 by electrical connections between the semiconductor die 203 and the leads of the second portion 229; as shown in FIG. 2A, in this example, the electrical connections are bond wires 235, although in an alternative arrangement, ribbon bonds can be used. The semiconductor die 203, the spacer dielectric 205, the bond wires 235, and portions of the package substrate 231 are covered with a mold compound 221, which forms a package body. The spacer dielectric 205 has a portion that extends past the first portions 227 of the lead frame, and the semiconductor die 203 has a portion including the bond pads that extends past the spacer dielectric 205.

The first portion 227 of the package substrate 231 is isolated from the semiconductor die 203 by the spacer dielectric 205, which is an insulator, and by die attach material (not shown) used to mount the spacer dielectric 205 to the first portion 227; and by die attach used to mount the semiconductor die 203 to the spacer dielectric 205. The package substrate may be a lead frame of a conductive metal, useful examples include copper, gold, Alloy 42, aluminum, stainless steel, steel, and alloys thereof. In examples, a copper lead frame can be used and can have a thickness between about 0.1 and 0.6 millimeters. The conductive lead frame can be formed by stamping or etching a sheet of the conductive material to form conductive leads, die pads, solid portions for low resistance conductive paths or to add strength, or to add divots, holes, openings and slots that form mold compound locks to increase adhesion of mold compound to the lead frame features.

Figure 2B:
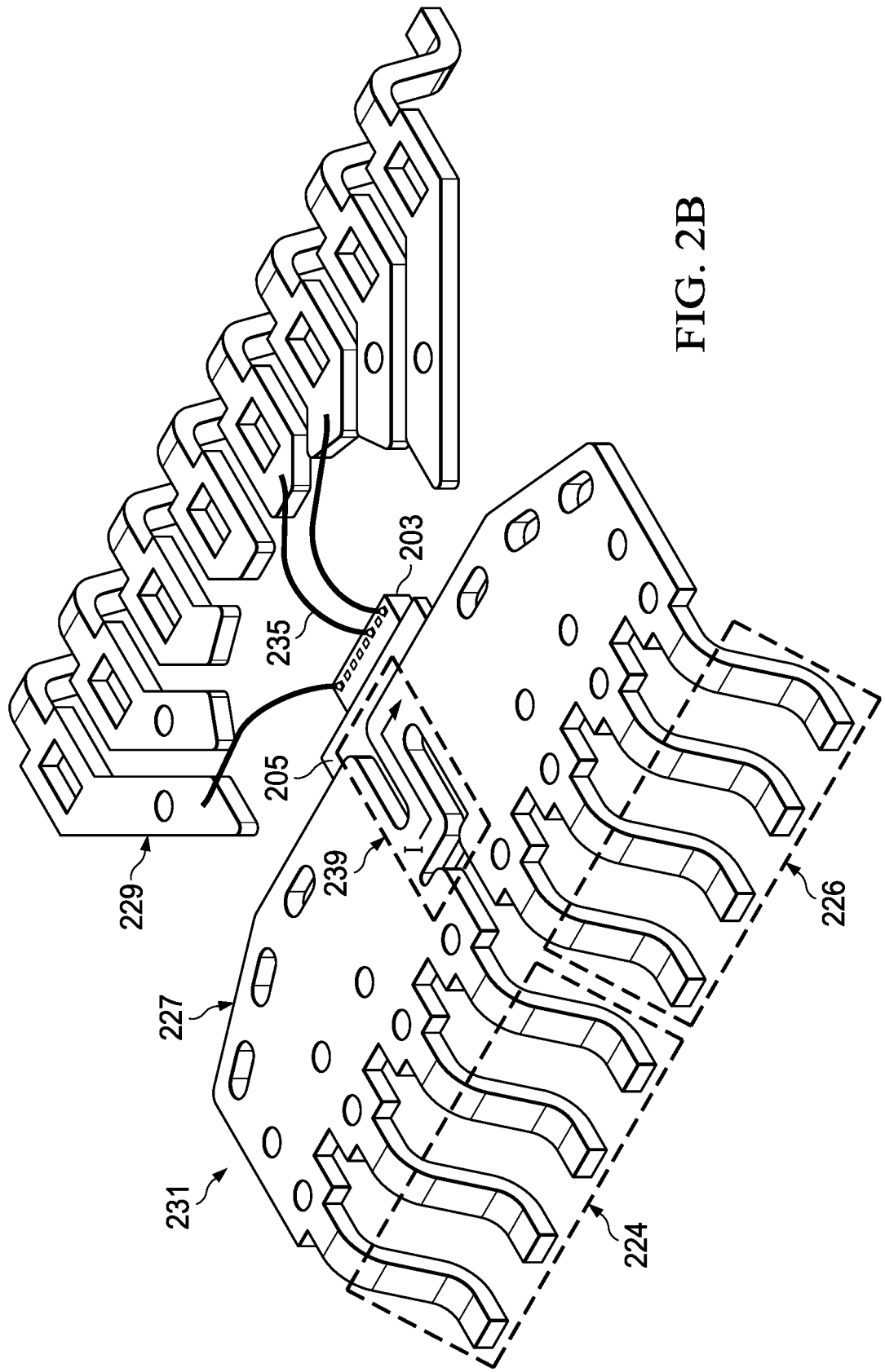

FIG. 2B illustrates features of FIG. 2A in more detail in another projection view, a partial view. In FIG. 2B, the first portion 227 of package substrate 231 has a first lead or first group of leads 224 configured to receive a current I; for example leads 224 may be coupled to a high voltage signal or supply of greater than several hundred volts, a kilovolt, or several kilovolts (kVs). Example ranges for the high voltage signal are from 300 Volts to 2 kVs. A second set of leads 226 is configured for outputting the current I to a second node. The current I flows through a current sense portion of the first portion 227 and the current I is carried over the semiconductor die 203. The spacer dielectric 205 is mounted to the first portion 227 of the package substrate 231 on a device side surface. The semiconductor die is mounted to the spacer dielectric 205 on an opposite side from the first portion 227. The first portion 227 of the lead frame has a current sense portion 239 coupled to carry the current I between the first leads 224 and the second leads 226. A portion of the semiconductor die 203 is beneath the current sense portion 239, and is positioned to be within a magnetic field produced by current I in current sense portion 239. The spacer dielectric 205, and die attach material that connects the spacer dielectric 205 to the first portion 227 of the package substrate 231, and die attach that connects the semiconductor die 203 to the spacer dielectric 205, these elements together provide isolation between the semiconductor die 203 and the first portion 227. The second portion 229 of the package substrate 231 is electrically connected to the semiconductor die 203 by bond wires 235. The bond pads of the semiconductor die 203 are exposed from the spacer dielectric 205 by mounting the semiconductor die 203 so that the bond pads are exposed from the spacer dielectric 205, so that only a portion of the semiconductor die 203 is covered by the spacer dielectric 205.

Current sense portion 239 of the first portion 227 is shown over the spacer dielectric 205, and semiconductor die 203 has a portion (not visible in FIG. 2B) that is aligned with the current sense portion 239 so that the semiconductor die 203 is exposed to the magnetic field that occurs due to current I flowing through the current sense portion 239. Current sense portion 239 is a conductor formed of the first portion 227 of the lead frame that carries the current I over the semiconductor die 203.

FIG. 2C illustrates the semiconductor device package 200 in a plan view, to better illustrate certain aspects. In FIG. 2C, the first portion 227 of the lead frame includes a first lead or first group of leads 224, and a second lead or second group of leads 226. First leads 224 are configured to be receive a current I from a first node, which can be a high voltage signal greater than several hundred volts, and up to 2 kilovolts, and the second lead or second group of leads 226 are configured to be coupled to a second node to output the current I. Current sense portion 239 is coupled between the first leads 224 and second leads 226 and is positioned over the spacer dielectric 205, and over a portion of the semiconductor die 203. A portion of the semiconductor die 203 is aligned with current sense portion 239 so that a magnetic field due to the current I flowing through the first portion 227 of the lead frame reaches the Hall element current sensor in the semiconductor die 203. In an example the current I is between 0 and 200 Amperes. The second portion 229 of the lead frame is coupled by bond wires 235 to bond pads on the semiconductor die. Mold compound 221 covers the semiconductor die 203, the spacer dielectric 205, the bond wires 235, and partially covers the lead frame including first portion 227 and the second portion 229, while leads of the lead frame are exposed from the mold compound 221.

Figure 2D:
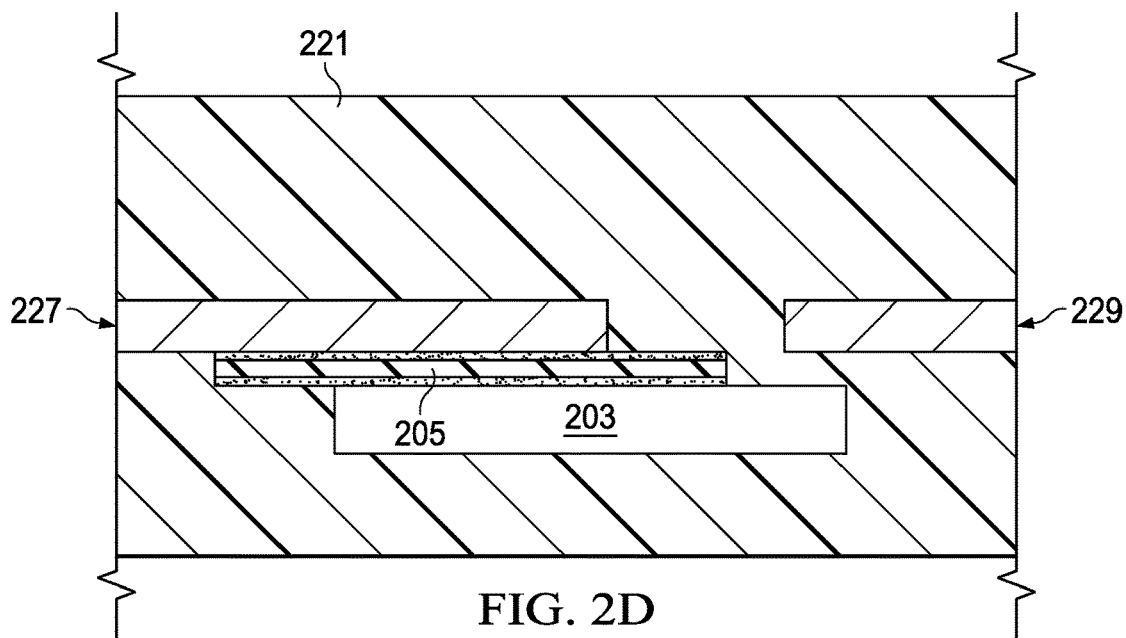
FIG. 2D is a cross section of a portion of the semiconductor device package.

FIG. 2D illustrates, in a close up cross section, portions of the semiconductor device package 200 illustrated in FIGS. 2A-2C. The first portion 227 of the lead frame has spacer dielectric 205 mounted to a device side surface, and semiconductor die 203 is mounted to the spacer dielectric 205. The first portion 227 has an opposite planar surface on the side facing upwards in FIG. 2D, opposite the planar device side surface. A second portion 229 of the lead frame is spaced from the first portion 227. Mold compound 221 covers the semiconductor die 203, the spacer dielectric 205, and a portion of the first portion 227 of the lead frame, and a portion of the second portion 229 of the lead frame. The mold compound 221, the first portion 227 of the lead frame, and the spacer dielectric 205 are formed of different materials and have different dielectric constants, and the semiconductor die 203 has another dielectric constant. When a high voltage is placed on the first portion 227 of the lead frame, an electric field appears in the materials, and electric field concentrations are increased at corners of conductors, and where different dielectric constant materials meet. For example, in FIG. 2D, the right edge of the first portion 227 (as shown in FIG. 2D) meets the mold compound 221 and the first spacer dielectric 205 at a corner of the first portion 227 of the lead frame, forming a "triple junction" where three different materials meet, the metal of the first portion 227 of the lead frame, the mold compound 221, and the spacer dielectric 205 (or die attach material between the spacer dielectric 205 and the first portion 227 of the lead frame).

Figure 2F:
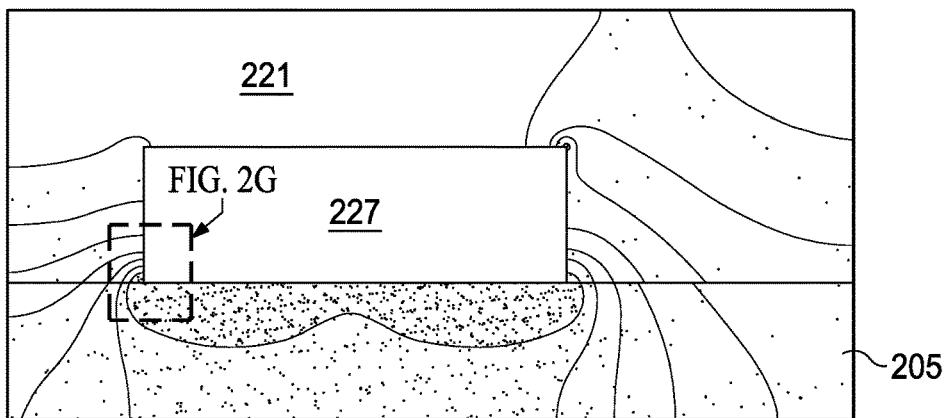
FIGS. 2F-2G illustrate additional finite element analysis simulation results indicating field concentration for the semiconductor device package.
Figure 2G:
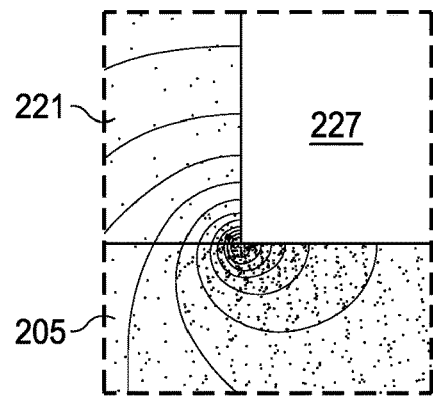
Figure 2E:
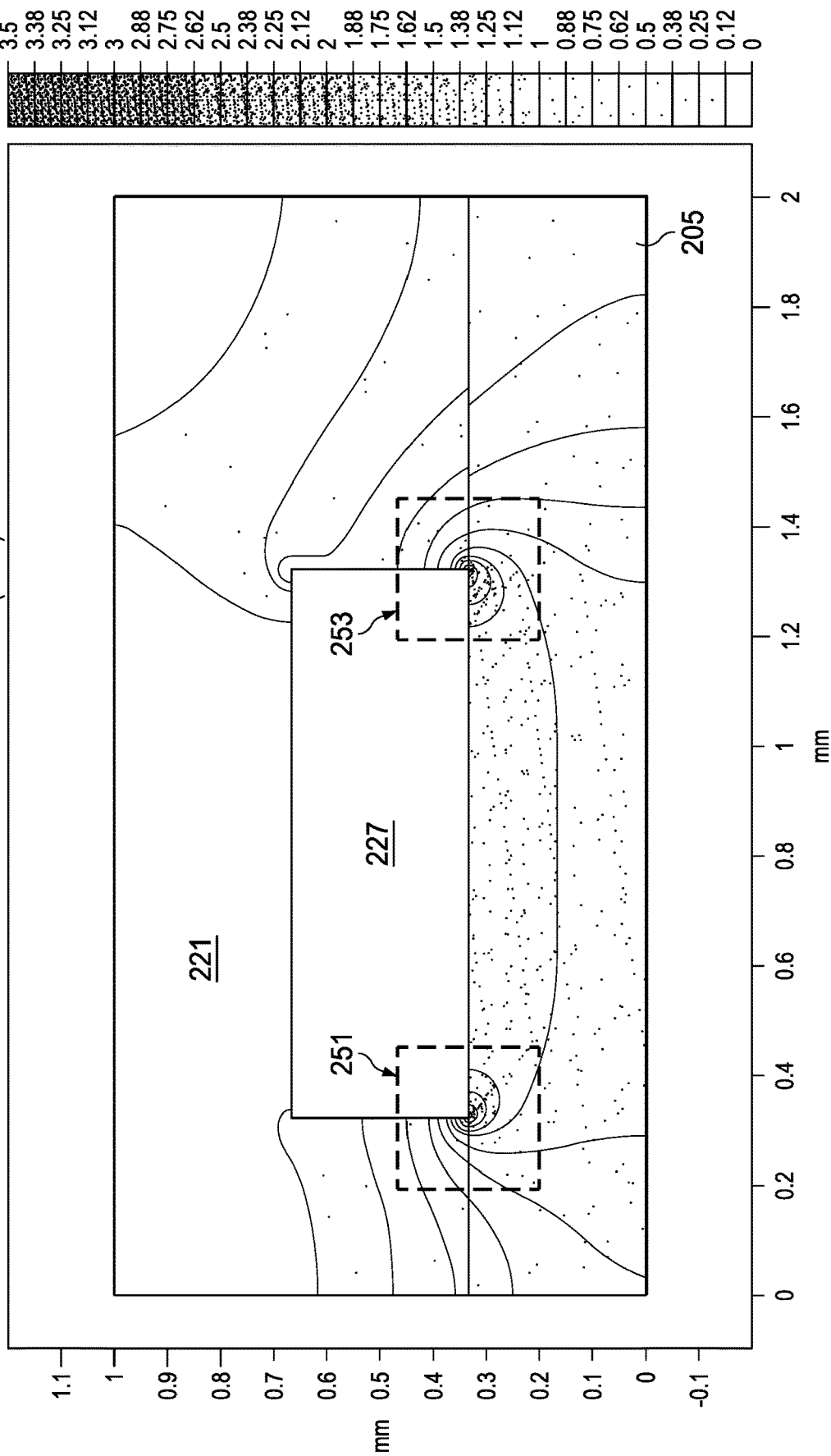
FIG. 2E illustrates a simulation result indicating electric field concentration for the semiconductor device package.

FIG. 2E illustrates in a graph a simulation showing the electric field concentrations of an end portion of the first portion 227, with a mold compound 221 surrounding portions of the first portion 227 of the lead frame, and a spacer dielectric 205 attached to a bottom surface of the first portion 227 of the lead frame. In the simulation a high voltage of 4 kVrms was applied. The electric field concentration is shown in V/um, the brighter areas indicate higher field strength in FIG. 2E. As shown in FIG. 2E, the highest electric field concentration, the brightest areas, are observed in the simulation at the triple junction of three different materials, which are shown in areas 251 and 253. In these areas, the conductor material of the first portion 227 of the lead frame contacts both the mold compound 221 and the spacer dielectric 205, a triple junction of materials with differing dielectric constants; the electric field concentration is greatest in these areas.

FIGS. 2F and 2G illustrate, in graphs, additional simulation results showing the electric field concentrations, the highest concentrations are the brightest areas. In FIG. 2F, a cross section of the first portion 227 of the lead frame is shown in an end view similar to the view in FIG. 2E, the first portion 227 contacts the mold compound 221 and the spacer dielectric 205, and the corner of the first portion 227 where the three different materials meet has the highest electric field concentration, shown as brightest areas in the graphs, FIG. 2G illustrates a close up view of a portion of FIG. 2F to further illustrate the highest concentration in the electric field is at the corners of the first portion 227.

High electric field concentrations in a semiconductor device package can lead to dielectric breakdown of the materials, forming arcs and unwanted conductive paths within the materials, causing conductive shorts, and can lead to device failures or can cause test failures of otherwise good devices, increasing costs.

Figure 3A:
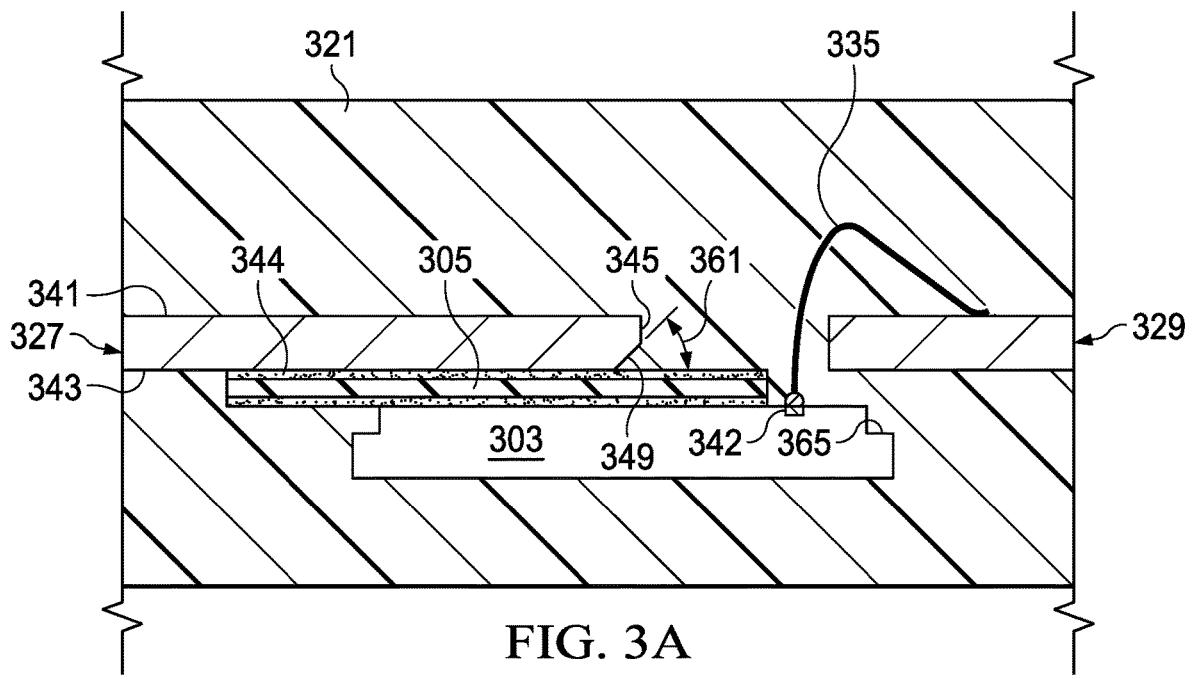
FIGS. 3A-3B are cross sectional views of example arrangements including structures for curtailing the electric field concentration in a semiconductor device package with isolation.
Figure 3B:
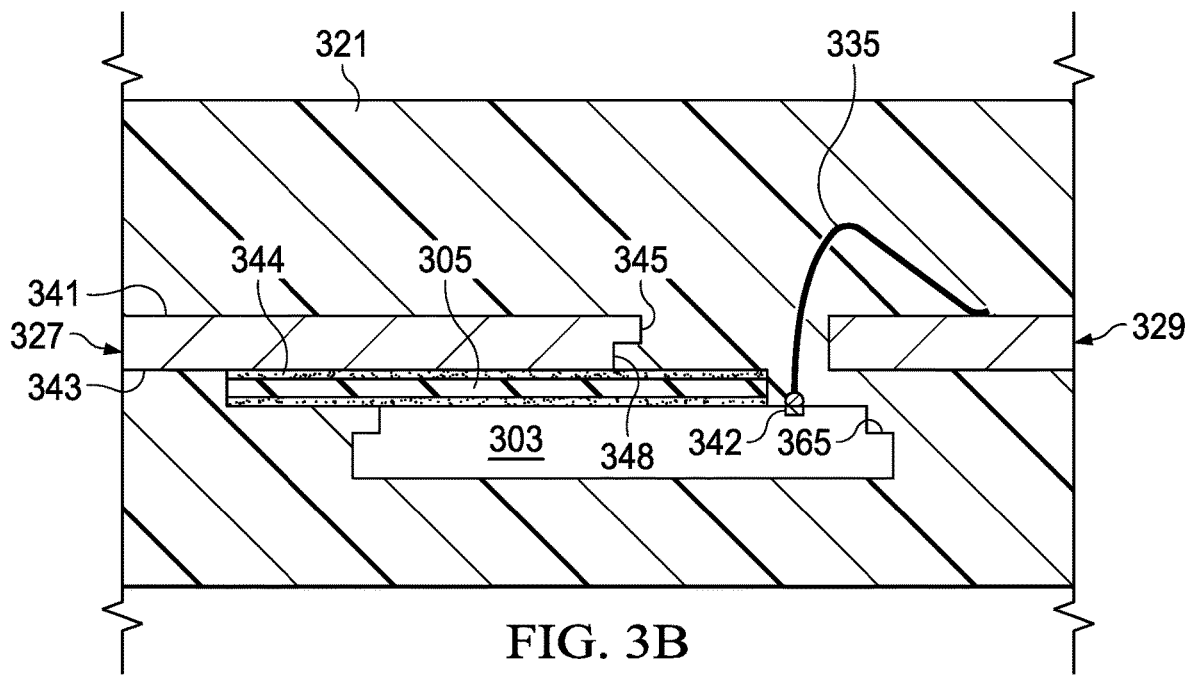

FIGS. 3A-3B illustrate, in close up views, structural features of alterative arrangements which, when used with the semiconductor device package 200 shown above, curtail concentrations of the electric field.

In FIG. 3A, a first portion 327 of a lead frame has a planar device side surface 343 and a planar opposite surface 341 opposite the device side surface. A side surface 345 extends normal to and from the planar opposite surface 341, and meets a recessed edge, in this example a chamfered edge 349, which extends at a slope from the side surface 345 inwards to meet the planar device side surface 343. The angle 361 can be about 45 degrees from the horizontal as shown in FIG. 3A. In alternative arrangements, this angle can vary, for example from 30 degrees to 60 degrees. A first surface of a spacer dielectric 305 is mounted to the planar device side surface 343 of the first portion 327 of the lead frame. The spacer dielectric 305 can be substrate material such as is used for printed circuit boards, including flame retardant 4 (FR4), glass reinforced fiber or epoxy, ceramic, film, laminates, or BT resin. The spacer dielectric 305 is mounted to the planar device side surface 343 with a first layer of die attach material 344. The die attach material can be non-conductive and can be a die attach film, paste or epoxy. The semiconductor die 303 has bond pads 342 that are electrically connected to the second portion 329 of the lead frame by bond wires 335. The lead frame in example arrangements can vary in size with the size of the semiconductor die and the current and voltages used in an arrangement. Useful sizes for the lead frame range from 3 millimeters by 5 millimeters to 12 millimeters by 12 millimeters. The spacer dielectric size can also vary with the application and the semiconductor die, in useful examples the spacer dielectric varies from 500 microns by 500 microns to 6 millimeters by 6 millimeters. The semiconductor die size also varies with the application and the circuitry needed to implement the sensor, useful example die sizes range from 300 by 200 microns to 5 millimeters by 5 millimeters. The spacer dielectric thickness can vary with the material selected and the application, useful examples range from 25-200 microns in thickness. The semiconductor die thickness can vary with the application and with the semiconductor process used, in examples the die thickness varies between 100 and 600 microns.

The chamfered edge 349 increases the spacing between the side surface 345 of the first portion 327 and the spacer dielectric 305 (when compared to the example formed without the arrangements as shown in FIG. 2D.) By increasing this spacing, the concentration of the electric field that occurs when a high voltage is present on the first portion 327 can be curtailed.

FIG. 3B illustrates, in another cross sectional view, an alternative arrangement that curtails the electric field concentration. In FIG. 3B, the first portion 327 of the lead frame has the side surface 345 extending from and normal to the planar opposite surface 341. A recessed edge, in this example a notched edge 348, is formed between the side surface 345 and the spacer dielectric 305, so that the lower corner of side surface 345 is spaced from the spacer dielectric 305 by the notched edge 348. The semiconductor die 303 has bond pads 342 that are electrically connected to the second portion 329 of the lead frame by bond wires 335. The semiconductor die 303 also has a notched edge as described above, in an alternative arrangement, the semiconductor die may not have the notched edge 365. In addition to the chamfered edge 349 on the first portion 327 of the lead frame of FIG. 3A, the semiconductor die 303 can have notched edge 365 of FIG. 3B, which also curtails the electric field concentration. The structures increase a creepage distance between surfaces, increasing the distance the electric field needs to traverse to reach the farther surfaces, decreasing the electric field concentration, which tends to be higher at corners or sharp points for example. The semiconductor die is mounted to cantilever out from, and extend past the edge of the first portion of the lead frame and from the edge of the spacer dielectric, the distance the die extends outwards also increases the creepage distance from the first portion of the lead frame to the semiconductor die, a useful extension distance is at least 100 microns.

The features of the arrangements that curtail the electric field can be formed using existing processes. The chamfered edge 349 of the first portion 327 of the lead frame shown in FIG. 3A can be formed using an etch or coining process on the lead frame. The notched edge 348 of the first portion 327 shown in FIG. 3B can be formed using a half etch process, where the lead frame surfaces are partially etched form both sides, for example. As is described further below the notched edge 365 of semiconductor die 303 can be formed in a dicing operation by using a wide blade to cut a trench in the scribe lanes between dies on a semiconductor wafer, and then subsequently using a narrower blade to cut through the semiconductor wafer in the trenches, the cut trenches forming the notched edges. Alternatively, etch processes can be used to form a trench that is then cut through in the scribe lane on the semiconductor wafer.

Figure 3C:
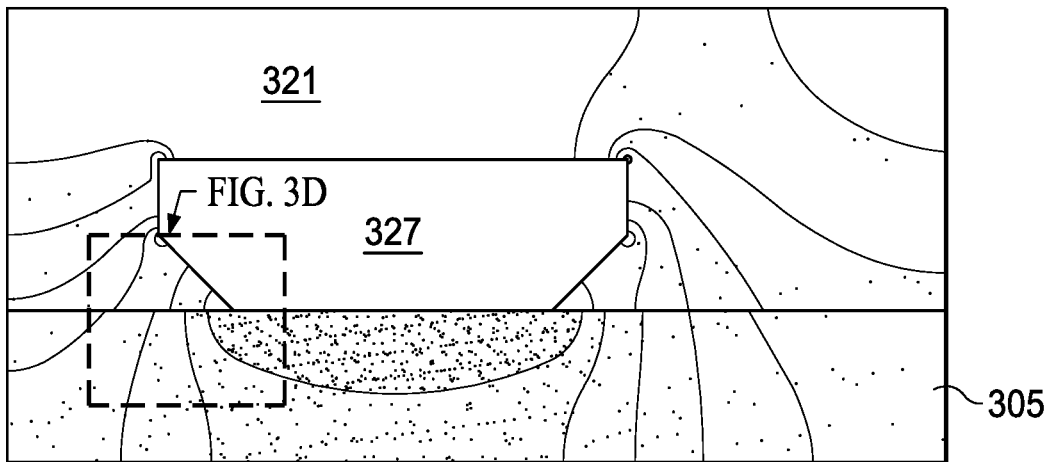
FIGS. 3C-3D illustrate in graphs finite element analysis simulation results indicating the electric field concentration for an example arrangement.
Figure 3D:
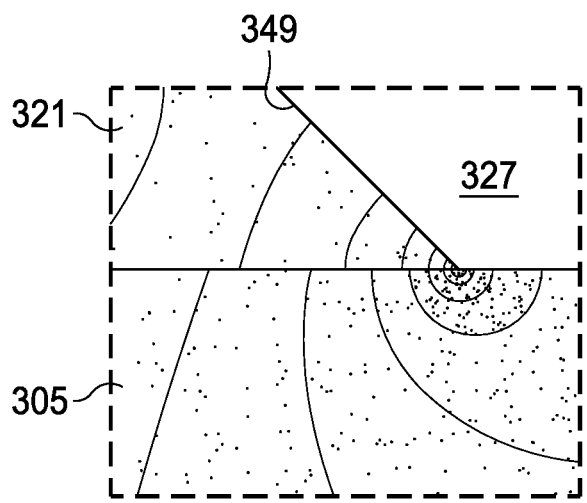

FIGS. 3C and 3D illustrate, in graphs, the results of simulations showing the effects of the use of the structures of the arrangements. In the simulations a 4 kVrms high voltage is applied to the first lead of the first portion of the lead frame and the resulting electric field concentrations are observed, the highest field concentrations are the brightest areas. In FIG. 3C, a cross sectional view shows the end of the first portion 327 of the lead frame of FIG. 3A, with the mold compound 321 and the spacer dielectric 305. As shown in FIG. 3C, the electric field concentration is less bright that in the similar graph of FIG. 2F, showing a reduction when the chamfered edge of FIG. 3A is used. FIG. 3D illustrates the area of highest concentration in greater detail, showing the chamfered edge 349 and the graph indicates a lower electric field concentration for the arrangements in FIG. 3A, when compared to the graphs of FIGS. 2F and 2G for a device without the arrangements. The highest electric field concentration is reduced by about 30 percent (compared to a simulation for the semiconductor device package formed without the arrangements).

Figure 4A:
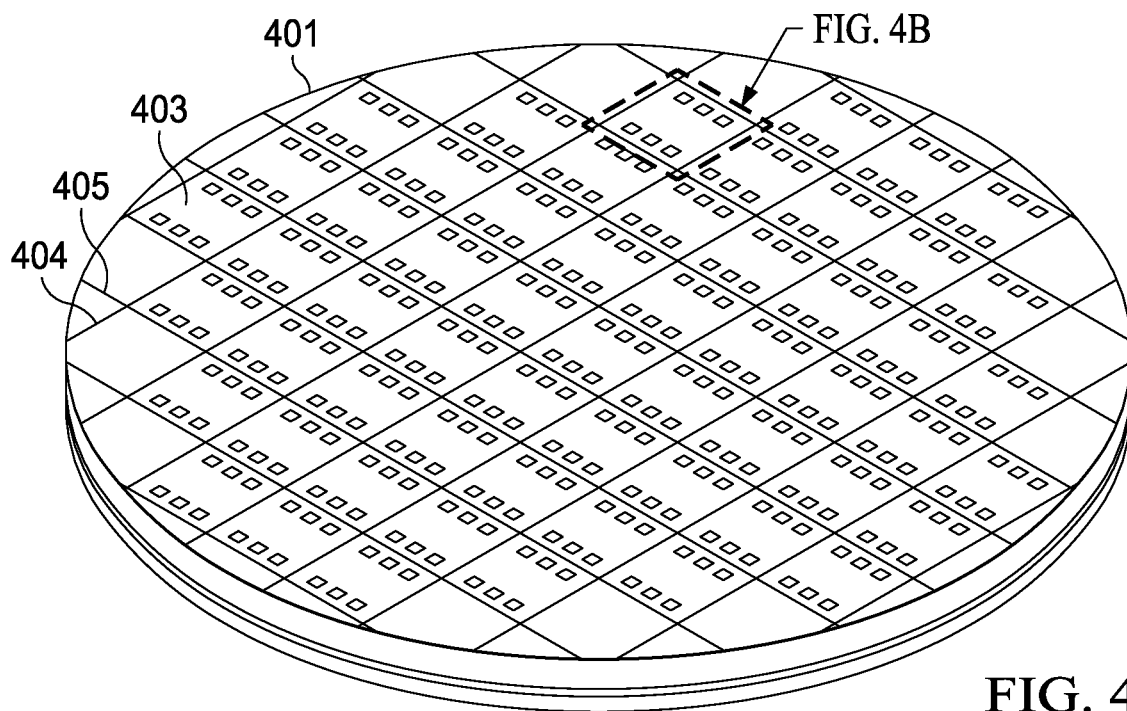
FIGS. 4A-4B illustrate in a projection view and a close up view a semiconductor wafer having semiconductor dies in rows and columns, and an individual semiconductor die for use with the arrangements.
Figure 4B:
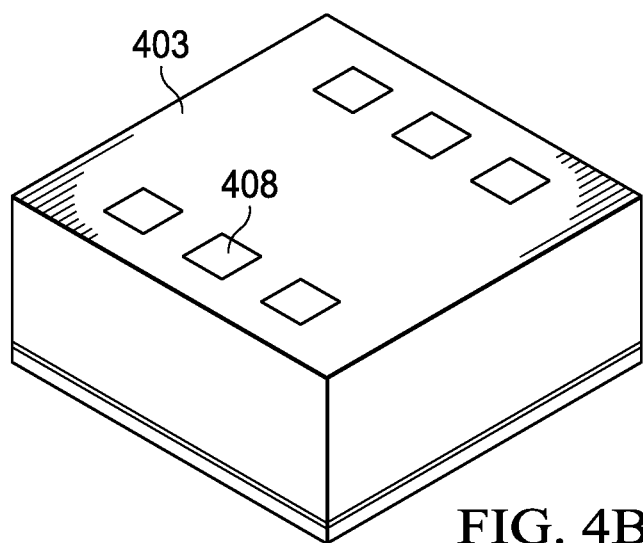

FIGS. 4A-4B illustrate, in projection views, a semiconductor wafer with semiconductor dies formed in rows and columns, and a semiconductor die after it is separated from the semiconductor wafer. In FIG. 4A, the semiconductor wafer 401 has semiconductor dies 403 formed on it. Scribe lanes 404 and 405 run across the wafer 401 between the semiconductor dies 403, the scribe lines are perpendicular to one another in parallel groups of scribe lanes. The semiconductor dies 403 can be separated from one another by mechanical sawing along the scribe lanes 404 and 405, or by use of a laser to score the wafer in the scribe lanes, and breaking the semiconductor wafer 401 along the scored lines. FIG. 4B illustrates, in a close up view, a semiconductor die 403 that can be used in an arrangement. Bond pads 108 are formed on a device surface of the semiconductor die 403. FIGS. 4A and 4B show how semiconductor dies are separated from a semiconductor wafer along scribe lanes.

FIGS. 5A-5D illustrate, in a series of cross sections, steps for forming a semiconductor die that is used in an arrangement. Referring to FIGS. 3A-3B, the semiconductor die 303 is shown with a notched edge 365. This notched edge helps curtail the concentration of the electric field in the semiconductor device package. In an example method, the notched edge can be formed during singulation of the semiconductor dies from a semiconductor wafer, by performing a first mechanical sawing operation to form a trench, and a second mechanical sawing operation to cut through the trenches to separate the dies from one another, and to form the notched edges.

Figure 5A:
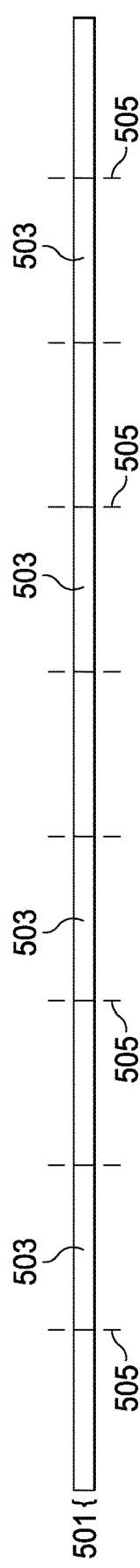
FIGS. 5A-5D illustrate, in a series of cross sectional views, selected steps in forming a semiconductor die that can be used in an arrangement.
Figure 5B:
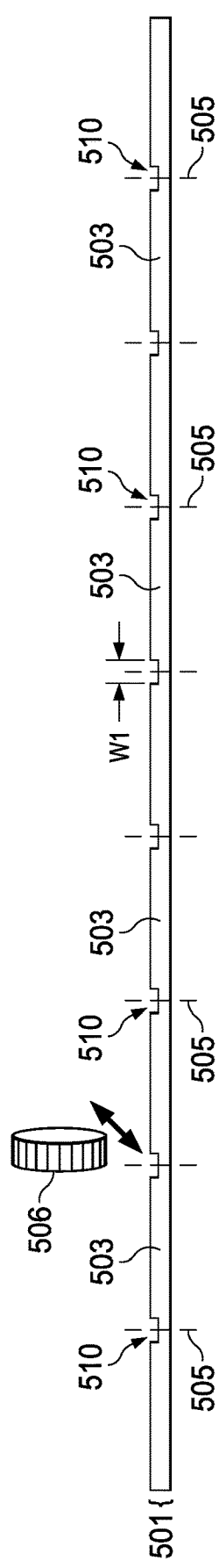

In FIG. 5A, a semiconductor wafer 501 is shown in cross section, with semiconductor dies 503 formed on it, and scribe lanes 505 shown between the semiconductor dies 503. At FIG. 5B, a first mechanical sawing operation is shown, with a saw 506 cutting between the dies 503 along the scribe lanes 505 to form trenches 510. The trenches 510 extend into the surface of the semiconductor wafer and have a width W1. In an alternative approach, the trenches 510 can be formed by a chemical etch using photolithography, and a photoresist.

Figure 5C:
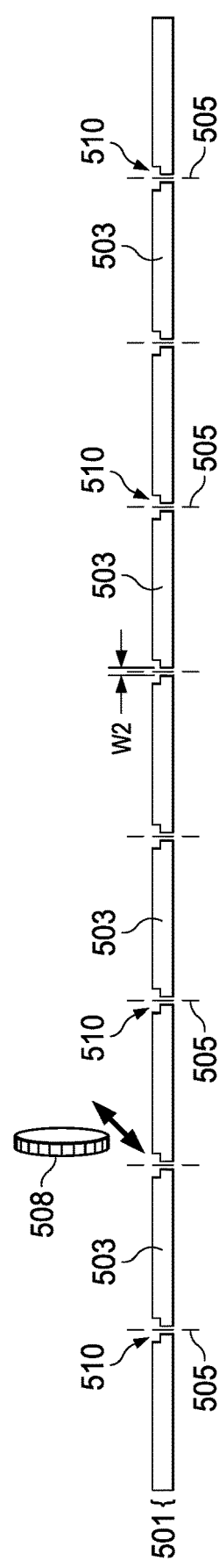
Figure 5D:
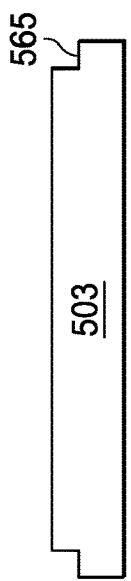

In FIG. 5C, the semiconductor dies 503 are separated from one another and removed from the semiconductor wafer 501 in a singulation process, where a second, thinner saw 508 traverses the scribe lanes 505 and cuts through the semiconductor wafer, the cuts having a width W2 that is less than the width W1 of the trenches 510. In FIG. 5D, a singulated semiconductor die 503 is shown with the recessed edges formed by notches 565 at the edges of an active surface 511 of the semiconductor die. When the semiconductor die 503 is mounted to the spacer dielectric in the semiconductor device package, the notches 565 increase the spacing between the first portion of the lead frame and the semiconductor die, and reduce the concentration of the electric field on the surfaces.

Figure 6:
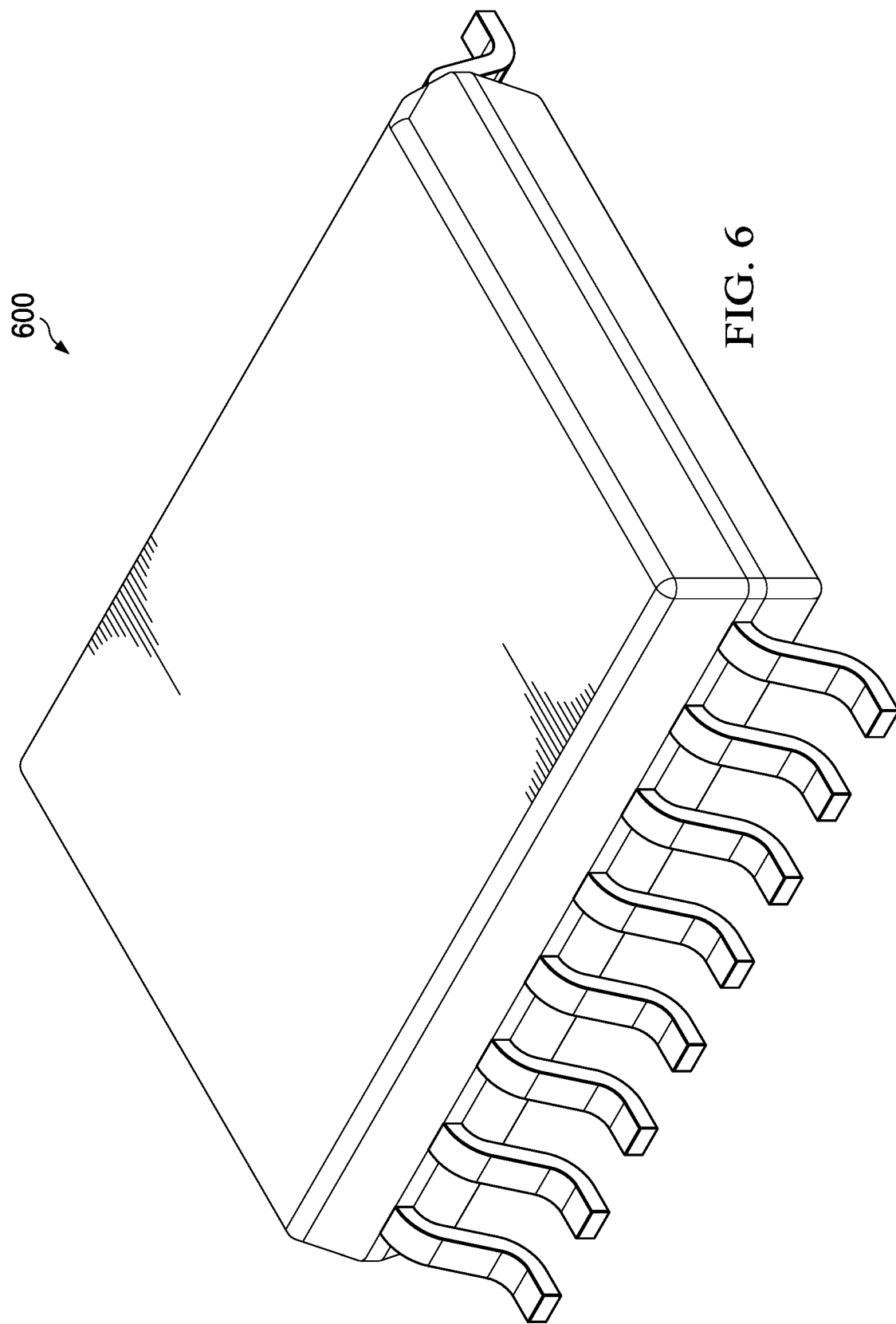
FIG. 6 illustrates, in a projection view, an example semiconductor device package that is useful with the arrangements.

FIG. 6 illustrates, in a projection view, a completed semiconductor device package 600 that can be used with an arrangement. In FIG. 6, a small outline integrated circuit (SOIC) package is shown. Other packages can be used with the arrangements, such as dual in line packages (DIPS), and no lead packages such as small outline no lead (SON) and quad flat no lead (QFN) packages.

The semiconductor device package 600 has the lead frame with two isolated portions (not visible, see FIGS. 2A-2C, and FIGS. 3A-3B), and the semiconductor die mounted to receive the magnetic field from a current in the first portion, but electrically coupled to the second portion, while isolated from the first portion. In this way, a high voltage that is far higher than the voltages the semiconductor die can tolerate can be used with a current sensor, while the semiconductor die is coupled to a lower voltage regime. Use of the structures of the arrangements to curtail the concentration of the electric field within the semiconductor device package reduces or eliminates arcs or shorts caused by dielectric breakdown of the materials that might occur when the electric field is concentrated within the semiconductor device package, such as is observed in packages formed without the arrangements.

Figure 7:
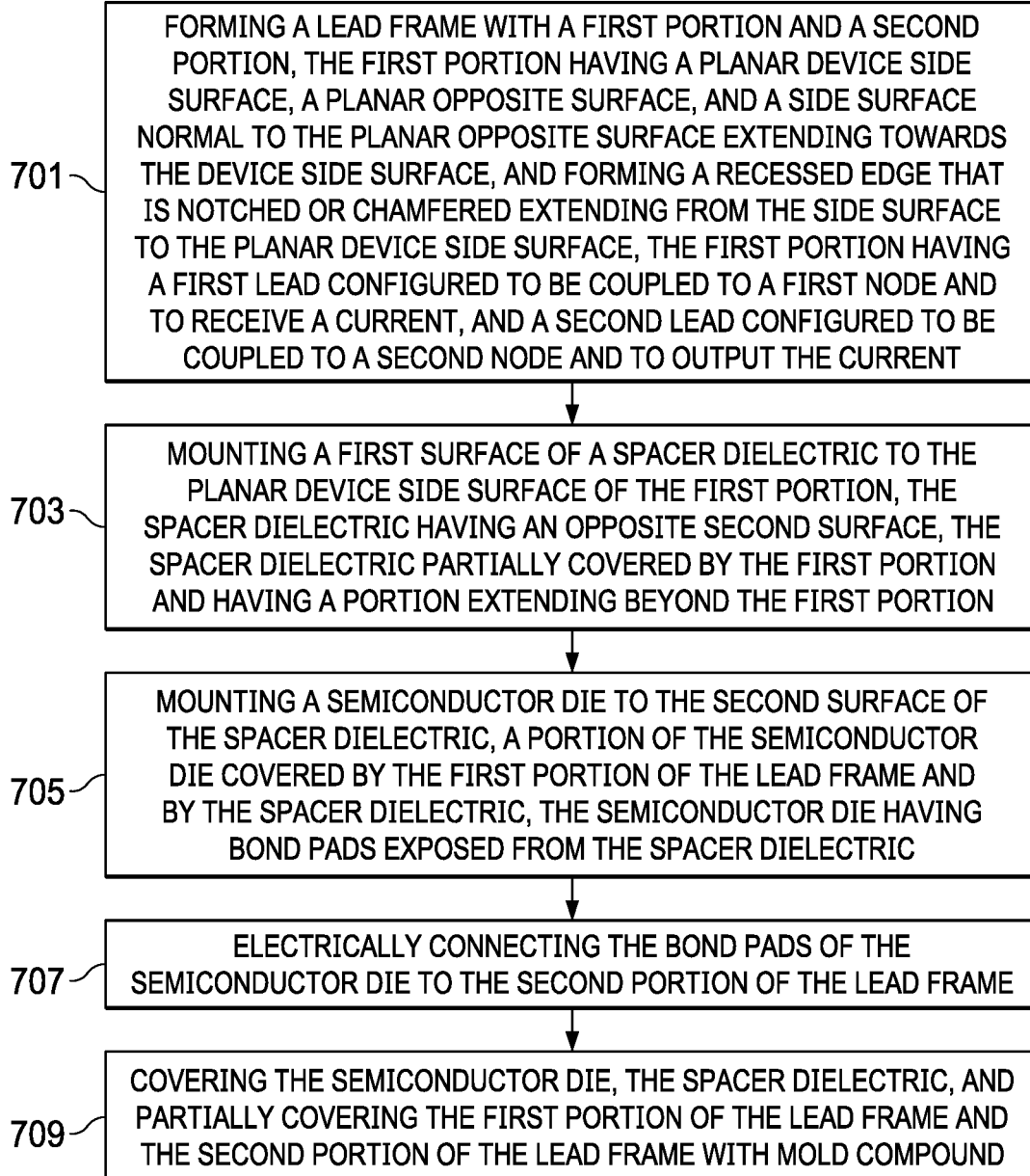
FIG. 7. illustrates, in a flow diagram, steps for forming an arrangement.

FIG. 7 illustrates, in a flow diagram, a method for forming an isolated semiconductor device package of the arrangements. In step 701, a lead frame is formed with a first portion and a second portion, the first portion having a planar device side surface, a planar opposite surface, and a side surface normal to the planar opposite surface extending towards the device side surface, and having a recessed edge that is notched or chamfered extending from the side surface to the planar device side surface, the first portion having a first lead configured to be coupled to a first node and to receive a current, and a second lead configured to be coupled to a second node and to output the current (see FIG. 3A, first portion 327 of a lead frame, with chamfered edge 349, and FIG. 2C, leads 224, 226).

At step 703, a first surface of a spacer dielectric is mounted to the planar device side surface of the first portion, the spacer dielectric having an opposite second surface, the spacer dielectric is partially covered by the first portion and having a portion extending beyond the first portion (see spacer dielectric 305 in FIGS. 3A-3B).

At step 705, the method continues by mounting a semiconductor die to the second surface of the spacer dielectric, a portion of the semiconductor die covered by the first portion of the lead frame and by the spacer dielectric, the semiconductor die having bond pads exposed from the spacer dielectric (see semiconductor die 303 of FIGS. 3A-3B).

At step 707, electrical connections are made between the bond pads of the semiconductor die and the second portion of the lead frame (see bond wires 335 in FIGS. 3A-3B). Alternative electrical connections include ribbon bonding.

At step 709, mold compound is used to cover the semiconductor die, the spacer dielectric, and to partially cover the first portion of the lead frame and to partially cover the second portion of the lead frame to form a packaged semiconductor device (see mold compound 321 in FIGS. 3A-3B, and semiconductor device package 600 in FIG. 6).

In example arrangements, structures are used within a semiconductor device package with isolation to curtail high concentrations of an electric field in the isolated device package. A first portion of a lead frame with leads configured to be coupled to a high voltage has a recessed edge that is notched or chamfered. A spacer dielectric has a first surface that is mounted to a device side surface of the lead frame, and a semiconductor die is mounted to an opposite second surface of the spacer dielectric. A second portion of the lead frame is electrically coupled to the semiconductor die and the semiconductor die, the spacer dielectric, parts of the first portion and parts of the second portion of the lead frame are covered in mold compound to form a semiconductor device package. In additional arrangements, the semiconductor die has a notched edge. Use of the structures of the arrangements in a semiconductor device package reduces the concentration of an electric field that occurs when the first portion of the lead frame is coupled to a high voltage.

Modifications are possible in the described arrangements, and other alternative arrangements are possible within the scope of the claims.

What is claimed is:

1. A semiconductor package comprising:
    a lead frame including a first portion and a second portion spaced from and electrically isolated from the first portion, the first portion including a planar device side surface and a planar opposite surface, and a side surface with a first side portion normal to the planar opposite and a second side portion at an angle with respect to the first side portion;
    a spacer dielectric mounted to the planar device side surface of the first portion of the lead frame;
    a semiconductor die mounted to the spacer dielectric;
    the second portion of the lead frame comprising leads coupled to the bond pads of the semiconductor die by electrical connections; and
    mold compound covering the semiconductor die, the electrical connections, the spacer dielectric, and partially covering the first portion of the lead frame and partially covering the second portion of the lead frame.

2. The semiconductor package of claim 1, wherein the semiconductor die is electrically isolated from the first portion of the lead frame.

3. The semiconductor package of claim 1, wherein the semiconductor die further comprises a current sensor that is configured to output a signal in response to a magnetic field in the first portion of the lead frame.

4. The semiconductor package of claim 3, wherein the current sensor comprises a Hall element formed in the semiconductor die.

5. The semiconductor package of claim 4, wherein the Hall element on the semiconductor die is configured to receive a magnetic field due to a current flowing in the current sense portion.

6. The semiconductor package of claim 3, wherein the current sense portion of the first portion of the lead frame is positioned over a portion of the semiconductor die.

7. The semiconductor package of claim 1, wherein the first portion of the lead frame further comprises a current sense portion that is positioned over a portion of the semiconductor die.

8. The semiconductor package of claim 1, wherein the angle of the second side portion of the side surface is between 30 and 60 degrees with respect to the planar device side surface.

9. The semiconductor package of claim 1, wherein the semiconductor die is partially covered by the spacer dielectric, the semiconductor die includes bond pads formed on a surface of the semiconductor die that extends beyond an edge of the spacer dielectric.

10. The semiconductor package of claim 1, wherein the spacer dielectric is flame retardant 4 (FR4), glass reinforced epoxy, bismaleimide triazine (BT) resin, ceramic, tape or film.

11. The semiconductor package of 1, wherein the semiconductor die has notched edges.

12. The semiconductor package of claim 1, wherein parts of the first and second leads of the first portion, and parts of the leads of the second portion, are exposed from the mold compound, and the mold compound forms a body of a semiconductor device package.

13. The semiconductor package of claim 1, wherein the lead frame is one selected from copper, gold, alloy 42, stainless steel, steel, or alloys thereof.

14. The semiconductor package of claim 1, wherein the spacer dielectric is mounted to the planar device side surface of the first portion of the lead frame by first die attach material and the semiconductor die is mounted to the second surface of the spacer dielectric by second die attach material.

15. The semiconductor package of claim 1, wherein the second side portion is recessed with respect to the first side portion.

* * * * *